United States Patent
Hara et al.

(10) Patent No.: US 10,478,867 B2
(45) Date of Patent: Nov. 19, 2019

(54) TREATMENT LIQUID SUPPLY DEVICE USING SYRINGE, AND WET TREATMENT DEVICE

(71) Applicant: NATIONAL INSTITUTE OF ADVANCED INDUSTRIAL SCIENCE AND TECHNOLOGY, Tokyo (JP)

(72) Inventors: Shiro Hara, Tsukuba (JP); Sommawan Khumpuang, Tsukuba (JP); Akio Kobayashi, Yaizu (JP); Takeshi Umino, Yaizu (JP); Sonoko Matsuda, Yaizu (JP)

(73) Assignee: NATIONAL INSTITUTE OF ADVANCED INDUSTRIAL SCIENCE AND TECHNOLOGY, Tokyo (JP)

( * ) Notice: Subject to any disclaimer, the term of this patent is extended or adjusted under 35 U.S.C. 154(b) by 265 days.

(21) Appl. No.: 15/532,846

(22) PCT Filed: Dec. 2, 2015

(86) PCT No.: PCT/JP2015/083868
§ 371 (c)(1),
(2) Date: Jun. 2, 2017

(87) PCT Pub. No.: WO2016/088798
PCT Pub. Date: Jun. 9, 2016

(65) Prior Publication Data
US 2018/0001354 A1 Jan. 4, 2018

(30) Foreign Application Priority Data
Dec. 2, 2014 (JP) .................................. 2014-244226

(51) Int. Cl.
*B08B 3/04* (2006.01)
*B08B 3/08* (2006.01)
(Continued)

(52) U.S. Cl.
CPC .................. *B08B 3/08* (2013.01); *B08B 3/04* (2013.01); *B08B 3/12* (2013.01); *H01L 21/6708* (2013.01);
(Continued)

(58) Field of Classification Search
CPC ....................................................... B08B 3/08
See application file for complete search history.

(56) References Cited

U.S. PATENT DOCUMENTS

2003/0180127 A1\* 9/2003 Kuroda ................. H01L 21/681
414/217
2014/0261803 A1\* 9/2014 Wang ........................ F17D 1/02
137/599.01

FOREIGN PATENT DOCUMENTS

JP      H09-213610 A    8/1997
JP      H10-263382 A    10/1998
(Continued)

OTHER PUBLICATIONS

Okuda et al., "Effect of spin development using a chemical solution of the minimum required," The 75th JSAP Autum Meeting Koen Yokoshu, 20a-A19-2, Sep. 17, 2014, p. 13-134.
(Continued)

*Primary Examiner* — Jason Y Ko
(74) *Attorney, Agent, or Firm* — Oliff PLC (57) ABSTRACT

A treatment liquid supply device and a wet treatment device with which an extremely small quantity of the treatment liquid can be accurately supplied, as a method for supplying a treatment liquid to an extremely small wafer of half inch size, including: a syringe that sucks and discharges the
(Continued)

treatment liquid; a treatment liquid bottle that is filled with the treatment liquid; a suction hose that has one end connected to the treatment liquid bottle and the other end connected to the syringe, and sucks the treatment liquid inside the treatment liquid bottle to the syringe; a supply hose that has one end connected to an intermediate section of the suction hose and serves to supply, to the surface of the wafer, the treatment liquid discharged by the syringe; and a three-way solenoid valve that controls opening/closing of each of the suction and supply hoses.

7 Claims, 4 Drawing Sheets

(51) Int. Cl.
*B08B 3/12* (2006.01)
*H01L 21/67* (2006.01)

(52) U.S. Cl.
CPC .. *H01L 21/67017* (2013.01); *H01L 21/67023* (2013.01); *H01L 21/67051* (2013.01)

(56) References Cited

FOREIGN PATENT DOCUMENTS

| | | |
|---|---|---|
| JP | 2002-174167 A | 6/2002 |
| JP | 2004-281464 A | 10/2004 |
| WO | 2012/029775 A1 | 3/2012 |
| WO | 2013/084574 A1 | 6/2013 |

OTHER PUBLICATIONS

Jan. 19, 2016 International Search Report issued in International Patent Application No. PCT/JP2015/083868.

\* cited by examiner

FIG. 4 ated Publication WO2012/029775
TREATMENT LIQUID SUPPLY DEVICE USING SYRINGE, AND WET TREATMENT DEVICE

TECHNICAL FIELD

The present invention relates to a treatment liquid supply device for supplying a treatment liquid filled in a treatment liquid tank to a predetermined supply position, and a wet treatment device.

BACKGROUND ART

In recent years, as a manufacturing line for a semiconductor device, minimal fabrication systems have been proposed in which basically one device is manufactured in a 0.5 inch size (half inch size) wafer, the manufacturing step is therefore composed of plural portable unit treatment devices, these plural unit treatment devices are easily re-arranged in flow shops and job shops, and thereby the minimal fabrication systems can properly cope with extremely small quantity production and multi-kind production (refer to Patent Literature 1 for example).

Also, with respect to a developing device used for the minimal fabrication system, a spin developing device has been proposed in which it is configured to rotate a wafer slowly at a rotation speed of a degree a developing solution is not spilled out from the top of the wafer in a state the developing solution of a quantity less than a quantity spilled out from the top of the wafer is dropped onto the wafer (refer to Patent Literature 2 for example).

CITATION LIST

Patent Literatures

Patent Literature 1: International Publication WO2012/029775
Patent Literature 2: International Publication WO2013/084574

SUMMARY OF THE INVENTION

Technical Problem

The minimal fabrication system of Patent Literature 1 described above is a method for treating a wafer of half inch size one sheet each by a unit treatment device. As a device for developing an object to be developed that is printed and so on onto a wafer of half inch size, although a spin developing device described in the Patent Literature 2 is known, such device is not known that can accurately supply a treatment liquid of an extremely small quantity of approximately 0.2 ml for example onto a wafer in a treatment liquid supply device for supplying a treatment liquid when a wafer (a body to be treated) of half inch size is developed or cleaned.

The present invention has been achieved in view of the circumstance in the related arts described above, and its object is to provide a treatment liquid supply device capable of accurately supplying a treatment liquid of an extremely small quantity as a method for supplying a treatment liquid to such an extremely small wafer as the half inch size which can be used for the minimal fabrication system described above and so on, and a wet treatment device.

Solution to Problem

In order to achieve the object described above, the present invention is made a treatment liquid supply device including: a syringe that sucks and discharges a treatment liquid; a treatment liquid tank that is filled with the treatment liquid; a filling pipe that has one end connected to the treatment liquid tank and the other end connected to the syringe, and causes the treatment liquid filled in the treatment liquid tank to be sucked into the syringe; a supply pipe that has one end connected to an intermediate section of the filling pipe and the other end disposed at a predetermined supply position, and supplies the treatment liquid discharged from the syringe to the predetermined supply position; and an opening/closing valve that is attached to a connection position of the supply pipe and the filling pipe, and is capable of controlling opening/closing of each of the supply pipe and the filling pipe.

According to the present invention configured thus, the syringe is driven in a state the supply pipe is closed and the filling pipe is opened by the opening/closing valve, a predetermined quantity out of the treatment liquid filled in the treatment liquid tank is sucked by the syringe, and thereafter the opening/closing valve produces a state of closing the filling pipe and opening the supply pipe. In this state, the syringe is driven to discharge the predetermined quantity of the treatment liquid sucked by the syringe to the supply pipe, and thereby the predetermined quantity of the treatment liquid can be supplied to a predetermined supply position through the supply pipe. Accordingly, even the treatment liquid of an extremely small quantity can be accurately supplied to the predetermined supply position by properly controlling the discharge quantity of the treatment liquid from the syringe, and therefore the present invention is suitable to a method for supplying a treatment liquid to a wafer that is extremely small such as half inch size for example.

Also, the present invention is made the treatment liquid supply device in which the syringe includes: a piston section including a pour-in port penetrating along an axial direction; and a syringe body having a bottomed cylindrical shape, at least a part on the base end side of the piston section being inserted to the syringe body in a manner movable forward or rearward in the axial direction, and the other end of the filling pipe is connected to the pour-in port on a distal end side of the piston section of the syringe.

According to the present invention configured thus, at an initial stage of the time when the piston section is moved relatively downward with respect to the syringe body to discharge the treatment liquid having been sucked into the syringe body from the pour-in port of the piston section to the filling pipe in a state where the distal end side of the piston section of the syringe is directed upward for example, gas having been sucked to the syringe body can be efficiently discharged from the pour-in port of the piston section to the filling pipe. Accordingly, before the treatment liquid having been sucked into the syringe body is supplied to the predetermined supply position, the piston section is moved relatively downward with respect to the syringe body to efficiently discharge the gas inside the syringe body, supply of the treatment liquid to the predetermined supply position is thereafter started, thereby dispersion of the supply quantity of the treatment liquid caused by the gas having been sucked into the syringe body can be suppressed, and therefore the treatment liquid can be accurately supplied to the predetermined supply position.

Also, the present invention is made the treatment liquid supply device in which the treatment liquid tank includes: an opening section for taking in the outside air accompanying suction of the treatment liquid; and a gas supply section that supplies an inert gas toward the opening section. According to the present invention configured thus, by supplying the inert gas toward the opening section of the treatment liquid tank, the gas inside the treatment liquid tank possibly taken in along with the treatment liquid in sucking the treatment liquid inside the treatment liquid tank to the syringe through the filling pipe can be made the inert gas. As a result, generation of a water mark and the like can be prevented, the water mark and the like possibly occurring when gas such as oxygen is taken in along with the treatment liquid and the treatment liquid is supplied to the predetermined supply position along with the gas taken in.

Also, the present invention is made the treatment liquid supply device in which the opening/closing valve is a three-way valve that can control opening/closing of the supply pipe and the filling pipe separately.

According to the present invention configured thus, by making the opening/closing valve that can control opening/closing of each of the supply pipe and the filling pipe a three-way valve that can control opening/closing of the supply pipe and the filling pipe separately, opening/closing control of each of the supply pipe and the filling pipe can be executed more accurately. As a result, the treatment liquid filled in the treatment liquid tank can be sucked into the syringe more accurately, and the treatment liquid sucked by the syringe can be supplied to the predetermined supply position more accurately.

Also, the present invention is made a wet treatment device including: a stage where a wafer is arranged; and the treatment liquid supply device for supplying a treatment liquid onto the wafer that is arranged in the stage, wherein the treatment liquid supply device supplies the treatment liquid of a quantity of a degree not spilled out from the top of the wafer onto the wafer.

According to the present invention configured thus, even the treatment liquid of a quantity of a degree not spilled out from the top of the wafer can be accurately supplied onto the wafer by discharging the treatment liquid from the syringe by driving of the syringe, the treatment liquid having been sucked by the syringe of the treatment liquid supply device.

Also, the present invention is made the wet treatment device further including a treatment liquid holding material having a generally circular column shape, the treatment liquid holding material being arranged so as to oppose the stage concentrically with the wafer that is arranged in the stage, wherein the treatment liquid supply device supplies the treatment liquid of a quantity of a degree not spilled out from a gap between the wafer arranged in the stage and the treatment liquid holding material to a gap between the wafer and the treatment liquid holding material.

According to the present invention configured thus, even the treatment liquid of a quantity of a degree not spilled out from the gap between the wafer arranged in the stage and the treatment liquid holding material can be accurately supplied to the gap between the wafer and the treatment liquid holding material by discharging the treatment liquid from the syringe by driving of the syringe, the treatment liquid having been sucked by the syringe of the treatment liquid supply device.

Also, the present invention is made a wet treatment device including: a stage where a wafer is arranged; the treatment liquid supply device for supplying a treatment liquid onto the wafer that is arranged in the stage; and a nozzle having a cylindrical shape, the nozzle being arranged so as to oppose the stage concentrically with the wafer that is arranged in the stage, the treatment liquid being supplied from the treatment liquid supply device to the nozzle, wherein the nozzle is formed to have an outside diameter dimension equal to or larger than the outside diameter dimension of the wafer.

According to the present invention configured thus, by making the outside diameter dimension of the nozzle equal to or larger than the outside diameter dimension of the wafer, the chemical liquid quantity accumulating on the wafer can be made constant. Furthermore, by making the supply rate of the treatment liquid from the nozzle constant and by supplying the treatment liquid onto the wafer at an intentionally controlled supply rate in this state, the treatment liquid having been supplied onto the wafer flows from the center to the outer periphery of the nozzle, and therefore the rate of the chemical reaction caused by supply of the treatment liquid and so on can be stabilized.

Also, the present invention is made the treatment liquid supply device in which the wafer has a disk shape with 12.5 mm outside diameter.

According to the present invention configured thus, even in the wafer having a disk shape with extremely small outside diameter of 12.5 mm used for so-called minimal fabrication system, by properly controlling the discharge quantity of the treatment liquid of the treatment liquid supply device, the treatment liquid of an extremely small quantity can be accurately supplied onto the wafer.

Advantageous Effects of Invention

According to the present invention, by properly controlling the discharge quantity of the treatment liquid from the syringe, even the treatment liquid of an extremely small quantity can be supplied accurately to the predetermined supply position.

DESCRIPTION OF EMBODIMENTS

Hereinafter, embodiments of the present invention will be explained based on drawings.

First Embodiment

<Overall configuration>

Figure 1:
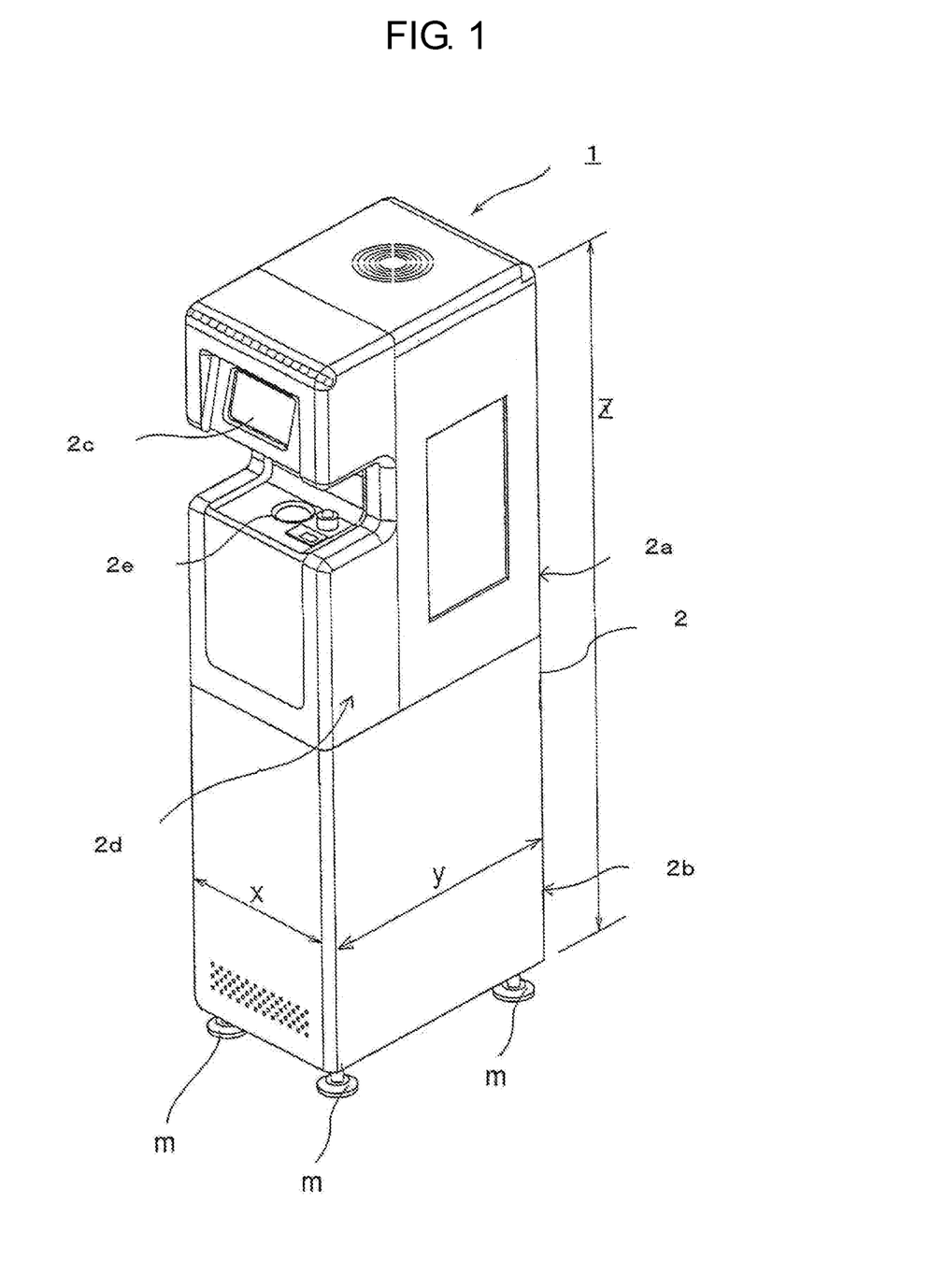
FIG. 1 is a perspective view that shows the outer appearance of a wet treatment device according to the first embodiment of the present invention.

As shown in FIG. 1, a wet treatment device 1 according to the first embodiment of the present invention is configured of a unit treatment device that is based on a concept of the minimal fabrication housed within a case 2 having a size standardized beforehand. The wet treatment device 1 is used when a chemical liquid L that is a predetermined treatment liquid is supplied onto a wafer W for example that is an object to be discharged for cleaning, and so on. Here, the minimal fabrication concept is optimum for the semiconductor manufacturing market of multi-kind and small quantity, can cope with various fabrication of resource saving, energy saving, investment saving, and high performance, and achieves a minimal production system that makes the production minimal described in JP-A No. 2012-54414 for example.

The case 2 is unified to a size of 0.30 m width (x)×0.45 m depth (y)×1.44 m height (z) formed into a generally rectangular parallelepiped shape having the longitudinal direction in the vertical direction, and has a construction of blocking infiltration of each of fine particles and gas molecules to the inside. In a device upper section 2a on the upper side of the case 2, various treatment device bodies 3 for treating the wafer W are housed. The treatment device body 3 has a structure capable of effecting one treatment step for cleaning the surface of the wafer W for example. On the lower side of the case 2, a device lower section 2b is arranged which is for incorporating a control device and the like that controls the treatment device body 3 within the device upper section 2a. In the device lower section 2b, various units used for treatment in the treatment device body 3 are housed. Also, in the device lower section 2b, support sections m for supporting the case 2 are arranged.

The middle section in the vertical direction of the device upper section 2a of the case 2 has such shape that the front face side of this device upper section 2a is cut in a shape recessed backwardly. To the front face side of the upper side of the device upper section 2a, an operation panel 2c is attached. The lower portion of the device upper section 2a is made a front chamber 2d that allows the wafer W to be conveyed into the case 2. At the generally center portion of the upper surface of the front chamber 2d, there is arranged a docking port 2e having a generally circular shape as a shuttle housing section for arranging a shuttle (not illustrated) as a conveyance container. The front chamber 2d is configured to block infiltration of each of fine particles and gas molecules into the case 2. To the front chamber 2d, there is attached a PLAD (Particle Lock Air-tight Docking) system (not illustrated) that can take the wafer W housed within the shuttle into and out of the case 2 without exposing the same to the outside air, and so on.

<Treatment Device Body>

The treatment device body 3 is a cleaning unit configuring a wafer cleaning machine as a wet treatment device that executes cleaning treatment of the surface of the wafer W having a generally disk shape or a generally rectangular shape formed into a predetermined size. Cleaning by the treatment device body 3 includes those objecting removal of a resist on the wafer W, etching, removal of the residue and the like adhered, and so on. The wafer W cleaned by the treatment device body 3 is shaped into a disk shape having the surface of a circular shape with a predetermined size, 12.5 mm (half inch size) diameter for example. The wafer W is formed with a predetermined pattern beforehand, and is made a state of the time before cleaning. Also, as the wafer W, a bare silicon wafer and the like also can be used where the photoresist film has been removed.

Figure 2:
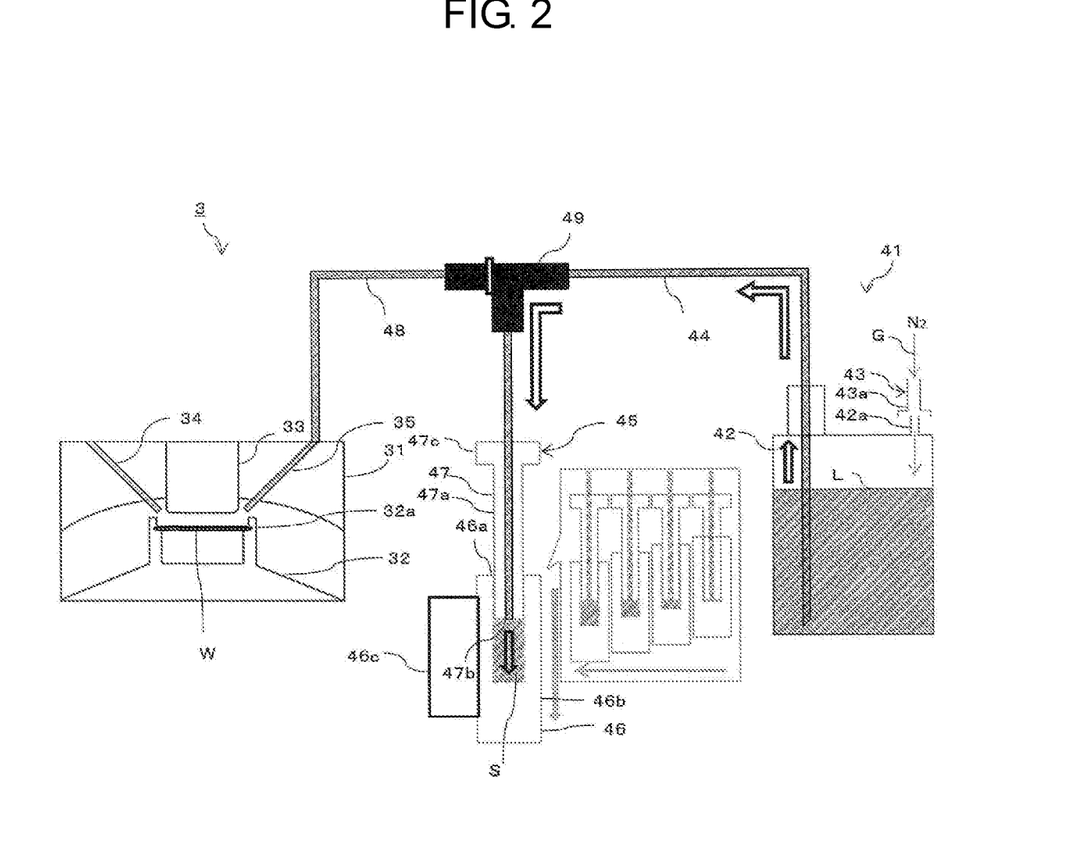
FIG. 2 is a schematic view that shows a part of the internal structure of the wet treatment device, and shows the motion in sucking the treatment liquid.
Figure 3:
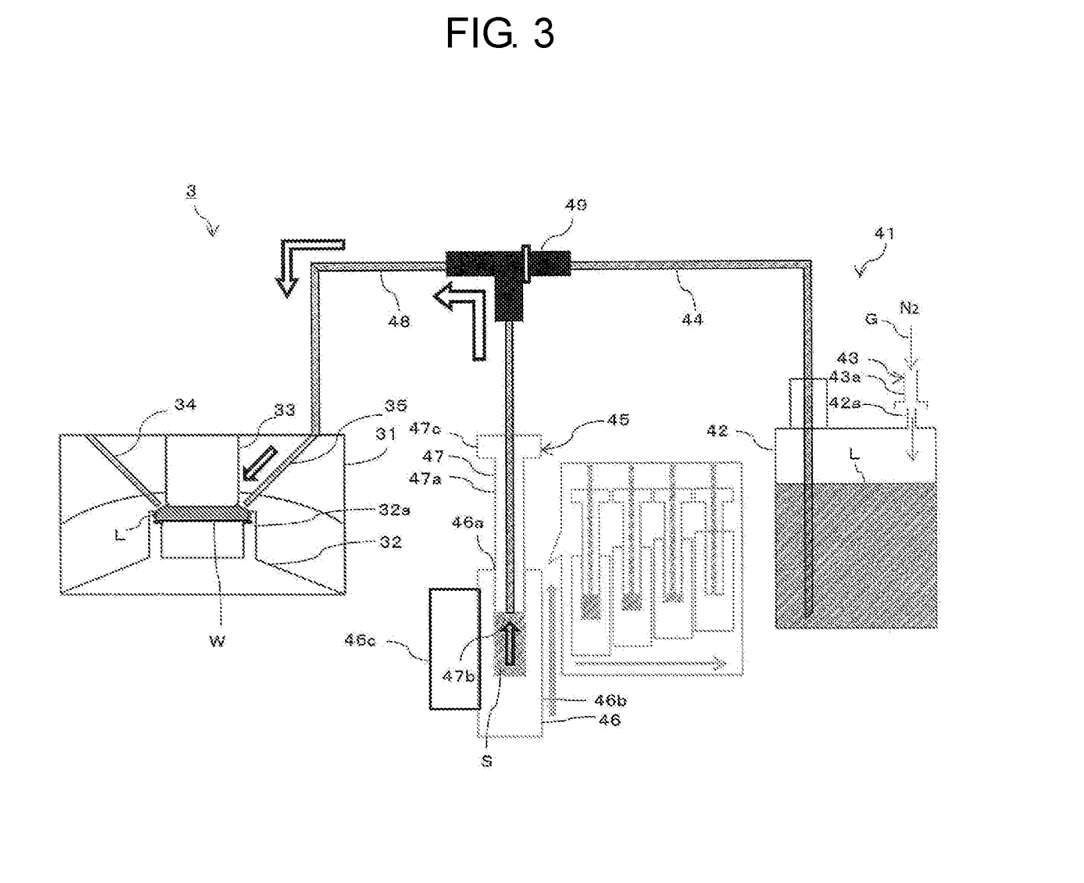
FIG. 3 is a schematic view that shows a part of the internal structure of the wet treatment device, and shows the motion in discharging the treatment liquid.

The treatment device body 3 includes a cleaning chamber 31 as shown in FIG. 2 and FIG. 3. A stage 32 is arranged at the center position of the cleaning chamber 31, and the stage 32 is provided with a locking piece section 32a for holding the wafer W at the top surface of the stage 32. The stage 32 is configured to be rotatable in the horizontal direction by a drive source (not illustrated) such as a motor for example, and a liquid holding material 33 having a circular column shape as a treatment liquid holding material is attached concentrically so as to oppose the upper surface of the stage 32. To the inside of the liquid holding material 33, a CCD camera (not illustrated) as a photographic device and an ultrasonic vibrator (not illustrated) are attached, the photographic device being for photographing the surface state of the wafer W that is locked to and held by the locking piece section 32a of the stage 32, the ultrasonic vibrator being for ultrasonically vibrating the chemical liquid supplied onto the wafer W through the liquid holding material 33.

To the inside of the cleaning chamber 31, nozzles 34, 35 are attached in plural numbers, approximately 2 pieces for example, the nozzles 34, 35 being for discharging a chemical liquid for supplying the chemical liquid L such as a hydrogen peroxide aqueous solution ($H_2O_2.H_2O$) and a hydroxide ammonium aqueous solution ($NH_4OH.H_2O$) for example to the surface of the wafer W that is locked to and held by the locking piece section 32a of the stage 32. Each nozzle 34, 35 is configured so that the distal end of each is in a state of being brought close to the gap between the locking piece section 32a of the stage 32 and the lower end surface of the liquid holding material 33, namely so that the chemical liquid L is supplied onto the wafer W from the lateral side of the stage 32. The chemical liquid L supplied by the nozzle 34, 35 is diluted into a predetermined concentration beforehand with a pure water, and is filled in a chemical liquid bottle 42 as a treatment liquid tank.

To the position adjacent to the cleaning chamber 31, there are attached chemical liquid supply devices 41 as the treatment liquid supply devices for supplying the predetermined chemical liquid L onto the wafer W that is locked to the locking piece section 32a of the stage 32 of the cleaning chamber 31 and is held onto the stage 32. The chemical liquid supply devices 41 are attached so as to be in the number of sets corresponding to the number of pieces of the nozzles 34, 35, or in concrete terms, so as to be one set of the chemical liquid supply device 41 for one piece of the nozzle. Each chemical liquid supply device 41 is provided with the chemical liquid bottle 42 for being filled with the predetermined chemical liquid L. The chemical liquid bottle 42 is formed into a bottomed cylindrical shape for example, and the chemical liquid L of a predetermined quantity of approximately 100 cc for example is filled and stored therein. In the chemical liquid bottle 42, there is provided an opening section 42a for sucking and taking in the outside air into the chemical liquid bottle 42 accompanying reduction of the volume by sucking of the chemical liquid L inside the chemical liquid bottle 42, and a nitrogen gas supply device 43 as a gas supply section is attached so as to oppose this opening section 42a. The nitrogen gas supply device 43 includes a blowing nozzle 43a for blowing nitrogen ($N_2$) gas G that is an inert gas to the opening section 42a and to suck the nitrogen gas G into the chemical liquid bottle 42 for supplying. The blowing nozzle 43a is expanded in diameter into a step shape at the distal end section, and is attached so that the distal end section of the opening section 42a is covered with the distal end side of the blowing nozzle 43a, while the distal end side of the blowing nozzle 43a is concentrically opposed to the distal end section of the opening section 42a of the chemical liquid bottle 42.

To the upper end section of the chemical liquid bottle 42, there is attached a suction hose 44 having a pipe shape for sucking the chemical liquid L inside the chemical liquid bottle 42. The suction hose 44 is a filling pipe for sucking the chemical liquid L stored inside the chemical liquid bottle 42 from the inside of the chemical liquid L to a syringe 45. One end of the suction hose 44 is inserted from the upper end section of the chemical liquid bottle 42 into the chemical liquid L inside the chemical liquid bottle 42. To the other end of the suction hose 44, there is attached the syringe 45 that is for sucking the chemical liquid L inside the chemical liquid bottle 42 through this suction hose 44. The syringe 45 includes a syringe body 46 and a piston section 47, the syringe body 46 having a bottomed generally cylindrical shape, the piston section 47 being inserted into this syringe body 46 so as to be movable forward and rearward. The syringe 45 is formed of a raw material excellent in durability such as a fluorine resin, and is configured to be capable of sucking the chemical liquid L of 1.5 ml for example.

The syringe body 46 is in a state of directing an opening section 46a upward, and a drive device 46c is attached to a peripheral surface section 46b having a cylindrical shape of this syringe body 46, the drive device 46c driving this syringe body 46 in the vertical direction namely along the axial direction. The drive device 46c includes a pulse motor (not illustrated) that is a precision motor capable of pulse control as a drive source thereof. Also, the drive device 46c is a linear movement machine that moves the syringe body 46 vertically along the axial direction by pulse-controlling and driving the pulse motor.

The piston section 47 includes a piston body 47a having a cylindrical shape with the outside diameter dimension equal to the inside diameter dimension of the peripheral surface section 46b of the syringe body 46. The piston body 47a is attached so that at least a part of the base end side of this piston body 47a is inserted from the opening section 46a of the syringe body 46 into the inside of the peripheral surface section 46b of the syringe body 46 so as to be capable of moving forward and rearward. Here, an internal space S from the bottom of the syringe body 46 to the lower end of the piston body 47a is arranged so that the maximum volume thereof becomes larger than the supply quantity of one time in supplying the chemical liquid L from the nozzle 35 to the wafer W. At the center position of the piston body 47a, a pour-in port 47b along the axial direction of this piston body 47a is arranged. The pour-in port 47b penetrates the piston body 47a from the distal end surface to the base end surface in the axial direction of the piston body 47a. On the base end side of the piston body 47a, a flange 47c having an annular shape is arranged, and the flange 47c is formed along the peripheral direction of this piston body 47a. Also, the piston section 47 is fixed to the outer side surface and the like of the cleaning chamber 31 and so on for example by screws in a state a part on the base end side of the piston body 47a is inserted to the opening section 46a of the cylinder body 46.

To the pour-in port 47b on the distal end side of the piston section 47, the other end side of the suction hose 44 is connected. To the intermediate section of the suction hose 44, there is connected one end side of a supply hose 48 for supplying the chemical liquid L discharged from the piston section 47 to a predetermined supply position namely onto the wafer W. The other end side of the supply hose 48 is connected to the base end side of the nozzle 35 which becomes the supply position of the chemical liquid L. In other words, the supply hose 48 is a supply pipe for supplying the chemical liquid L from the intermediate section of the suction hose 44 to the nozzle 35, the chemical liquid L being pushed by the piston section 47 and discharged from the pour-in port 47b by moving the syringe body 46 of the syringe 45 upward.

To the connecting position of the suction hose 44 and the supply hose 48, there is attached a three-way solenoid valve 49 as an opening/closing valve that can control opening/closing of each of these suction hose 44 and supply hose 48. The three-way solenoid valve 49 is a three-way valve configured so as to be capable of controlling opening/closing of the suction hose 44 and the supply hose 48 separately. The three-way solenoid valve 49 controls the suction hose 44 to open while controlling the supply hose 48 to close when the syringe body 46 of the syringe 45 is moved downward and the chemical liquid L inside the chemical liquid bottle 42 is sucked into the syringe body 46, and controls the supply hose 48 to open while controlling the suction hose 44 to close when the syringe body 46 is moved upward and the chemical liquid L sucked into the syringe body 46 is supplied to the nozzle 35.

Next, a method for discharging the chemical liquid by the chemical liquid supply device 41 according to the first embodiment will be explained referring to FIG. 2 and FIG. 3.

<Filling Step>

There is caused a state that the blowing nozzle 43a of the nitrogen gas supply device 43 continues to blow the nitrogen gas G to the opening section 42a of the chemical liquid bottle 42, and the surrounding of the opening section 42a of the chemical liquid bottle 42 is made a state of increasing the concentration of the nitrogen gas G. Also, as shown in FIG. 2, the three-way solenoid vale 49 is driven to close one end side of the supply hose 48 and to open the intermediate section of the suction hose 44, and there is caused a state that the chemical liquid L inside the chemical liquid bottle 42 can be sucked by the syringe 45. In this state, the drive device 46c is driven to move the syringe body 46 of the syringe 45 downward and to expand the internal space S between the bottom of the piston section 47 and the syringe body 46, thereby the chemical liquid L filling the inside of the suction hose 44 flows into the syringe body 46, and the chemical liquid L inside the chemical liquid bottle 42 is sucked into the suction hose 44. At this time, due to reduction of the filling quantity of the chemical liquid L inside the chemical liquid bottle 42 accompanying suction of the chemical liquid L inside the chemical liquid bottle 42 into the suction hose 44, the nitrogen gas G of high concentration is sucked from the opening section 42a of the chemical liquid bottle 42 into the chemical liquid bottle 42.

<Supply Step>

As shown in FIG. 3, in a state the inside of the syringe body 46 of the syringe 45 is filled with a predetermined quantity of the chemical liquid L, the three-way solenoid vale 49 is driven to close the intermediate section of the suction hose 44 and to open one end side of the supply hose 48, and a there is caused state that the chemical liquid L inside the syringe 45 can be supplied onto the wafer W. In this state, the drive device 46c is driven to move the syringe body 46 of the syringe 45 upward and to reduce the internal space S inside the syringe body 46, thereby the chemical liquid L inside the syringe body 46 passes through the pour-in port 47b of the piston section 47 and is discharged, and the chemical liquid L filling the inside of the supply hose 48 is supplied to the nozzle 35 and is supplied onto the wafer W. At this time, by accurate control of the upward moving distance of the syringe body 46 by the drive device 46c, a predetermined quantity of the chemical liquid L filling the space between the bottom surface section of the liquid holding material 33 and the surface of the wafer W and of a degree not spilled out from the surface of the wafer W can be accurately supplied onto the wafer W.

<Continuous Steps>

Further, by making the upward moving distance of the syringe body 46 a predetermined distance and moving the syringe body 46 stepwise at every treatment of the wafer W, a predetermined quantity of the chemical liquid L is discharged at every time from the pour-in port 47b of the piston section 47. Therefore, the chemical liquid treatment of plural wafers W becomes possible using a predetermined quantity of the chemical liquid L sucked into the syringe body 46.

<Action and Effect>

In general, since the syringe is a kind of a tank for storing a chemical liquid, the syringe is used normally for using a chemical liquid between a fraction to the total quantity of a predetermined quantity filled in the inside of the syringe at once. A typical example of it is an injector. Thus, ordinary syringes are employed for a use of using a chemical liquid once as a matter of practice. Therefore, the syringe is not used normally for precise liquid supply. Also, as another use of the syringe, there is also a case of using it in dropping the chemical liquid from one droplet to several droplets, and so on. This case is a case the chemical liquid of a small quantity is dropped and added to an object, and the chemical liquid is dropped by that a man pushes the piston section of the syringe and so on in most cases.

On the other hand, there exists also a syringe called a micro-burette that can drop a chemical liquid of a precise quantity. However, the method for supplying a chemical liquid of the syringe is same to that of a dropper, and is a method in which a man takes the chemical liquid from a separate raw material tank by suction and fills the syringe tank with the same, and therefore the chemical liquid cannot be supplied continuously. Although there also exists a device in which a robot fills the syringe with a chemical liquid on behalf of a man, since it is necessary to move to a raw material tank to take the chemical liquid when the syringe is filled with the chemical liquid in this case also, the chemical liquid cannot be supplied continuously, and there are problems that the syringe itself should be moved spatially and that the nozzle section of the syringe is tainted with the chemical liquid or contaminated.

Further, there also exists a piston pump called a plunger pump, and this piston pump includes a valve and is configured that the discharge quantity of the chemical liquid per one time of opening/closing of this valve becomes constant. However, the piston pump has such a risk that pulsation of the chemical liquid accompanying opening/closing of the valve may occur. Thus, with respect to the syringe and the piston pump, it is not easy to supply the chemical liquid of a minute flow rate continuously while being controlled precisely and freely.

On the other hand, with respect to a pump that supplies the chemical liquid of a small flow rate, although it is considered theoretically that the size thereof only has to be reduced, as the size becomes smaller, minute micro-processing is required, and it is not easy to extend the life of the pump and to suppress the production cost. Also, in almost all types of the pump, since the chemical liquid of a constant quantity is supplied dividedly, there is still a risk of occurrence of the pulsation of the chemical liquid.

Also, a problem in precisely controlling a chemical liquid is a risk that, at a chemical liquid discharge port such as a nozzle, the chemical liquid of a minute quantity accumulates by a surface tension at a portion of the distal end of the outlet, the chemical liquid is not actually discharged even when the chemical liquid is pushed out by press-feeding of the pump and the like, and the chemical liquid accumulates at the portion of the distal end of the outlet. Further, at the same time, when the quantity of the chemical liquid having been discharged and departing from the chemical liquid discharge port is small because of the surface tension, there is also a problem that the chemical liquid becomes droplets and is supplied intermittently.

Therefore, in the chemical liquid supply device 41 related to the first embodiment described above, it is configured to be capable of supplying the chemical liquid L continuously without pulsation by precisely controlling each of the supply rate and the supply quantity of the chemical liquid L of a minute flow rate. In concrete terms, the syringe 45 and the three-way solenoid valve 49 are used, the drive distance of the syringe body 46 when the syringe body 46 of the syringe 45 is vertically moved by the drive device 46c is accurately controlled, and thereby the chemical liquid L inside the chemical liquid bottle 42 can accurately fill the inside of the syringe body 46 and can be supplied from the syringe body 46 onto the wafer W accurately.

Particularly, by making the drive device 46c a pulse motor and pulse-controlling this drive device 46c to accurately control the vertical movement of the syringe body 46, the filling quantity and the discharge quantity of the chemical liquid L to the syringe 45 can be accurately controlled at an order of 0.001 ml for example. Accordingly, even the chemical liquid L of an extremely small quantity such as 0.2 ml for example can be accurately supplied to the surface of the wafer W, therefore the chemical liquid supply device 41 related to the first embodiment described above is optimum as a method for supplying a chemical liquid onto the extremely small wafer W of half inch size adapted to the minimal fabrication concept, and can accurately supply even the chemical liquid L to the gap between the wafer W and the liquid holding material 33, the chemical liquid L being of a very small quantity of a degree not spilled out from a gap between the surface of the wafer W locked to and held by the locking piece section 32a of the stage 32 and the bottom surface section of the liquid holding material 33 by the surface tension of the chemical liquid L.

Also, since it is configured that the syringe body 46 is moved linearly by the drive device 46c, the piston section 47 of the syringe 45 can be pushed continuously. Therefore, pulsation is not caused in the chemical liquid L discharged from the piston section 47 of the syringe 45. Also, since the speed for driving the syringe body 46 can be controlled by the moving speed of the drive device 46c, the syringe body 46 can be moved under very precise control. Accordingly, the discharge pressure of the chemical liquid L from the piston section 47 of the syringe 45 also can be controlled by the moving speed of the drive device 46c.

Also, by moving the syringe body 46 of the syringe 45 downward, suck back of the nozzles 34, 35 can be executed. Here, "suck back" means to make the chemical liquid L flow backward slightly and to prevent the chemical liquid L from attaching to the distal end portion of the nozzle as a droplet in order to prevent such event that a droplet of the chemical liquid L running off the nozzles 34, 35 accumulates at the distal end portion of the nozzle because of the surface tension of the distal end portion of the nozzle, the droplet unintentionally falls in drops afterwards, and the discharge quantity with which the chemical liquid L should be supplied from the syringe 45 and the supply quantity of the chemical liquid L actually supplied differ each other. Although, a complicated mechanism is normally necessary in order to achieve suck back, in the first embodiment described above, suck back can be achieved only by moving the syringe body 46 downward.

Also, by bringing the nozzles 34, 35 close to the wafer W so as to have a distance equal to or less than the droplet size of the chemical liquid L discharged from the nozzles 34, 35, a constant quantity of the chemical liquid L discharged from the nozzles 34, 35 can be supplied onto the wafer W without becoming a droplet. Particularly, by the syringe 45 using mechanical piston movement of mechanically moving the syringe body 46, a constant quantity of the chemical liquid L can be supplied onto the wafer W without pulsation. Therefore, by bringing the outlet of the nozzles 34, 35 close to the wafer W so as to have the distance equal to or less than the droplet of the chemical liquid L, the chemical liquid can be supplied at a constant rate.

Particularly, in the first embodiment described above, since the maximum volume of the internal space S of the syringe 45 is made larger than the supply quantity supplied from the nozzles 34, 35 to the wafer W one time, the rate of supply of the chemical liquid from the nozzles 34, 35 can be made perfectly constant for the entire period from start of supply to completion of supply. Also, when the outside diameter is made 1.2 mm and the inside diameter is made 0.8 mm for example in the nozzles 34, 35, the droplet thereof becomes approximately 0.013 cc. When this droplet is assumed to be a spherical body, the outside diameter of the droplet is approximately 1.5 mm. Accordingly, by bringing the nozzles 34, 35 to the wafer W closer than 1.5 mm, the droplet comes not to be formed, and therefore the chemical liquid L can be supplied continuously.

Particularly, the chemical liquid bottle 42 filled with approximately 49 ml of the first chemical liquid (hydroxide ammonium aqueous solution) obtained by diluting 14 ml of hydroxide ammonium ($NH_4OH$) with 35 ml of pure water ($H_2O$) and the chemical liquid bottle 42 filled with 98 ml of the second chemical liquid (hydrogen peroxide aqueous solution) obtained by diluting 28 ml of hydrogen peroxide ($H_2O_2$) with 70 ml of pure water are prepared, these first chemical liquid and second chemical liquid are supplied by each syringe 45 by 0.1 ml each (0.2 ml in total) to the surface of the wafer W from each nozzle 34, 35, thereby these first chemical liquid and second chemical liquid can be mixed at the position immediately before being supplied to the surface of the wafer W, and the chemical liquid L whose mixing ratio is made 1:1:5 of (hydroxide ammonium):(hydrogen peroxide):(pure water) can be supplied to the surface of the wafer W.

Also, with respect to the syringe 45, the opening section 46a of the syringe body 46 is in a state of being directed upward, and the pour-in port 47b for sucking and discharging the chemical liquid L penetrates the piston section 47 side. Therefore, in a case gas (outside gas) such as nitrogen G is sucked when the syringe body 46 is moved downward and the chemical liquid L is sucked into the syringe body 46 in a state the inside of the syringe body 46 is not filled with the chemical liquid L for example, the gas moves upward because of the specific gravity difference against the chemical liquid L and accumulates around the pour-in port 47b in the lower portion of the piston section 47. Accordingly, in the early stage namely the initialized stage in moving the syringe body 46 upward in this state and discharging the chemical liquid L from the pour-in port 47b of the piston section 47, the chemical liquid L having been sucked into the syringe body 46, the gas having been sucked to the syringe body 46 can be discharged namely drawn out efficiently from the pour-in port 47b of the piston section 47. Therefore, in a state before the chemical liquid L having been sucked into the syringe body 46 is supplied to the surface of the wafer W, the syringe body 46 is moved upward to efficiently return the gas having been sucked into the syringe body 46 to the chemical liquid bottle 42, thereafter the syringe body 46 is moved upward further to start to supply the chemical liquid L to the surface of the wafer W, and thereby dispersion of the supply quantity of the chemical liquid L caused by the gas having been sucked into the syringe body 46 can be suppressed. As a result, the chemical liquid L can be supplied from the syringe 45 to the surface of the wafer W more precisely.

Also, the nitrogen gas G is blown toward the opening section 42a of the chemical liquid bottle 42 by the nitrogen gas supply device 43, the surrounding of the opening section 42a of the chemical liquid bottle 42 is made an atmosphere of high concentration of the nitrogen gas G, and the syringe body 46 is moved downward in this state to suck the chemical liquid L inside the chemical liquid bottle 42 to the syringe body 46. As a result, the gas inside the chemical liquid bottle 42 possibly taken in along with the chemical liquid L in sucking the chemical liquid L inside the chemical liquid bottle 42 to the syringe body 46 can be made an inert gas namely the nitrogen gas G of high concentration. Therefore, generation of the water mark and the like can be prevented which possibly occur in such case that gas such as oxygen is taken in along with the chemical liquid L, the chemical liquid L is supplied to the surface of the wafer W along with the gas having been taken in, and the wafer is subjected to treatment of the chemical liquid.

Also, it is configured that opening/closing of each of the suction hose 44 from the chemical liquid bottle 42 to the syringe 45 and the supply hose 48 from the intermediate section of the suction hose 44 to the nozzles 34, 35 is executed by one three-way solenoid valve 49. Therefore, by controlling the opening/closing operation of this one three-way solenoid valve 49, the flow passage for sucking the chemical liquid L from the chemical liquid bottle 42 to the syringe 45 and the flow passage for supplying the chemical liquid L from the syringe 45 to the surface of the wafer W can be correctly separated. Accordingly, the chemical liquid L having filled the chemical liquid bottle 42 can be sucked into the syringe body 46 more accurately, and the chemical liquid L having been sucked to the syringe body 46 can be supplied to the surface of the wafer W more precisely and accurately. At the same time, since it is configured that the chemical liquid L is sucked from the chemical liquid bottle 42 into the syringe body 46 in using the chemical liquid L and the chemical liquid L having been sucked into the syringe body 46 is supplied onto the wafer W, deterioration and the like of the chemical liquid L can be prevented and frequency of replacement of the chemical liquid bottle 42 can be reduced, and therefore the burden of the user can be reduced.

Also, as a method for adding a chemical liquid not yet reacted and quickly discharging a chemical liquid having reacted while keeping the chemical liquid L on the wafer at a constant quantity, as done in the first embodiment described above, the liquid holding material 33 of a circular column shape having a diameter same to that of the wafer W is disposed on the wafer W so as to be close to the wafer W. With this configuration, the quantity of the chemical liquid supplied onto the wafer W can be kept at a constant quantity. In this case, in supplying the chemical liquid, it is necessary that the chemical liquid L is discharged from the outside to the gap between the wafer W and the liquid holding material 33 to flow in. Particularly, with the aim of promoting discharging of the chemical liquid L onto the wafer W, it is preferable that the outside diameter of the liquid holding material 33 is made slightly smaller than the outside diameter of the wafer W.

Second Embodiment

<Configuration>

The second embodiment of the present invention is different from the first embodiment described above in that the first embodiment is configured to arrange the nozzles 34, 35 at the lateral side of the stage 32 and to supply the chemical liquid L from these nozzles 34, 35 to the gap between the wafer W on the stage 32 and the liquid holding material 33, whereas the second embodiment is configured that the chemical liquid L is supplied from the nozzle 35 over the wafer W that is arranged on the stage 32. In other words, in the wet treatment device 1 according to the second embodiment, as shown in FIG. 4, the configuration excluding the nozzle 35 and the liquid holding material 33 is similar to that of the first embodiment, and the construction of the nozzle 35 is different from that of the first embodiment.

Figure 4:
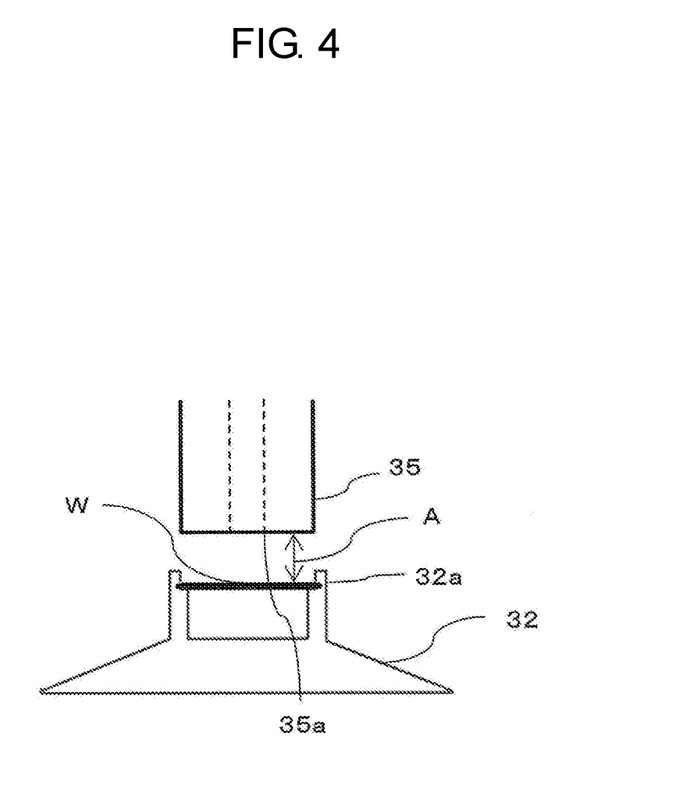
FIG. 4 is a schematic view that shows a part of the internal structure of a wet treatment device according to the second embodiment of the present invention.

In concrete term, as shown in FIG. 4, the nozzle 35 is formed into a cylindrical shape having a chemical liquid discharge port 35a in the lower portion, and is attached concentrically in the vertical direction with respect to the wafer W that is locked to and held by the locking piece section 32a of the stage 32. The nozzle 35 has the outside diameter of the distal end thereof generally equal to the outside diameter dimension of the wafer W that is arranged on the stage 32, and is attached so as to form a predetermined gap A between the surface of the wafer W and the lower end surface of the nozzle 35.

<Action and Effect>

In general, when the surface of the wafer W that is an object to be discharged is a flat plane, since there does not exist an infinite size in the flat plane, an end section of the flat plane exists. A typical example is the wafer W of a disk shape having a predetermined size. In such case, surface tension works at the end section, the chemical liquid L discharged from the nozzle 35 gradually accumulates on the wafer W by the surface tension generated at the end section of the wafer W even when the chemical liquid L is supplied at a quite stable and intended supply rate, the chemical liquid quantity on the wafer W temporally changes even when the chemical liquid L is supplied at a preset supply rate, and therefore there is a risk that also the rate of the chemical reaction by the chemical liquid L supplied onto the wafer W temporally changes.

Accordingly, in the wet treatment device 1 according to the second embodiment described above, the outside diameter of the distal end of the nozzle 35 is made a size equal to the outside diameter of the wafer W. As a result, the surface tension generated in the chemical liquid L is determined not by the wafer W itself but by the end section of the wafer W and the lower end section of the nozzle 35. Although the fluid quantity of the chemical liquid L that can be supplied onto the wafer W is up to the height of approximately 1 mm only in the case of the wafer W whose outside diameter is larger than 20 mm, the surface tension at the end section gradually increases in the case of the small wafer W whose outside diameter is 15 mm or less. For example, at the surface of the silicon wafer, water can be held to the height of 4 mm without being spilled out from the surface. In other words, in order that the chemical liquid L is supplied by an extremely small quantity, the chemical liquid L is constantly supplied to the surface of the wafer W by a constant quantity, and reacted matter generated as a result of the chemical reaction by the chemical liquid L and contaminated matter are quickly discharged from the surface of the wafer W, the surface tension generated at the end section of the wafer W is inexpediency.

On the other hand, in the wet treatment device 1 according to the second embodiment described above, it is configured that the outside diameter of the distal end of the nozzle 35 and the outside diameter of the wafer W are made generally equal dimension, and that the chemical liquid L accumulates in a gap A between these nozzle 35 and wafer W. As a result, the gap A becomes a kind of a sealed space holding the chemical liquid L, and the chemical liquid of a constant quantity that is determined by the distance between these nozzle 35 and wafer W can be held. Also, when the chemical liquid L of a small fluid quantity is added and supplied from the nozzle 35, the chemical liquid L of a portion added and supplied runs off and is discharged from the gap A between the nozzle 35 and the wafer W. As a result, when the diameter of the nozzle 35 and the wafer W is equal, the surface tension at the end section of the wafer W can be made not work.

For example, when the outside diameter of the nozzle 35 is smaller than the outside diameter of the wafer W, the chemical liquid L is liable to accumulate at the surface of the wafer W which has protruded outward beyond the outside diameter of the nozzle 35. On the other hand, when the outside diameter of the nozzle 35 is larger than the outside diameter of the wafer W, the chemical liquid L of a portion running off from the surface of the wafer W drops by the own weight. However, since the upper portion of the wafer W opposing the vicinity of the outer peripheral portion of the nozzle 35 is not the end section but is flat, the surface tension easily works by the outer peripheral portion of the nozzle 35, and there is a risk that the chemical liquid L adheres to the outer peripheral portion of the nozzle 35. In this case also, the chemical liquid quantity on the wafer W can be defined basically to be a fluid quantity determined by the distance between the wafer W and the nozzle 35 namely the gap A.

As a result, by making the outside diameter of the wafer W and the nozzle 35 equal, or by making the outside diameter of the nozzle 35 larger than the outside diameter of the wafer W, the chemical liquid quantity accumulating on the wafer W can be made constant. Also, by making the supply rate of the chemical liquid L from the nozzle 35 a constant rate or by supplying the chemical liquid L at a supply rate intentionally controlled while the outside diameter of the nozzle 35 is made generally equal to or larger than the outside diameter of the wafer W, the chemical liquid L supplied onto the wafer W flows from the center of the nozzle 35 to the outer periphery of the wafer W and comes to flow in one direction heading to the outer periphery from the center of the wafer W through the gap A between these nozzle 35 and wafer W, and therefore the rate of the chemical reaction occurring between the chemical liquid L and the wafer W can be stabilized.

<Others>

Further, although the wet treatment device 1 supplying a chemical liquid to the surface of the wafer W of half inch size adapted to the minimal fabrication concept was explained in each embodiment described above, the present invention is not limited to it, and can be a device that supplies a treatment liquid to an object to be treated other than the wafer W such as a resist mask. Also, with respect to the chemical liquid L, other than a hydrogen peroxide aqueous solution and a hydroxide sodium aqueous solution, a mixed liquid of fluoric acid, ozone, sulfuric acid and a hydrogen peroxide aqueous solution, or a hydroxide potassium aqueous solution, and so on also can be adapted and used.

Further, the chemical liquid supply device 41 depends on the chemical liquid L supplied, can use plural sets of the chemical liquid supply device 41 according to the kind of the chemical liquid L supplied, and can be also made one set of the chemical liquid supply device 41 that uses the chemical liquid bottle 42 filled with the chemical liquid L that is mixed at a predetermined mixing ratio beforehand. With respect to the nozzles 34, 35 of the treatment device body 3 also, different nozzle 34, 35 may be used for every chemical liquid supply device 41, and plural kinds of the chemical liquid L may be mixed at the base end side of one nozzle 35.

REFERENCE SIGNS LIST

1 Wet treatment device
2 Case
2*a* Device upper section
2*b* Device lower section
2*c* Operation panel
2*d* Front chamber
2*e* Docking port
3 Treatment device body
31 Cleaning chamber
32 Stage
32*a* Locking piece section Liquid holding material (treatment liquid holding material)
34, 35 Nozzle
35*a* Chemical liquid discharge port
41 Chemical liquid supply device (treatment liquid supply device)
42 Chemical liquid bottle (treatment liquid tank)
42*a* Opening section
43 Nitrogen gas supply device (gas supply section)
43*a* Blowing nozzle
44 Suction hose (filling pipe)
45 Syringe
46 Syringe body
46*a* Opening section
46*b* Peripheral surface section
46*c* Drive device
47 Piston section
47*a* Piston body
47*b* Pour-in port
47*c* Flange
48 Supply hose (supply pipe)
49 Three-way solenoid valve (three-way valve, opening/closing valve)
W Wafer
L Chemical liquid (treatment liquid)
m Support section
G Nitrogen gas (inert gas)
S Internal space
A Gap

The invention claimed is:

1. A wet treatment device comprising:
a stage including a locking piece for holding a wafer;
a treatment liquid supply device, comprising:
   a syringe that sucks and discharges a treatment liquid onto the wafer that is arranged in the stage;
   a treatment liquid tank that is filled with the treatment liquid;
   a filling pipe that has one end connected to the treatment liquid tank and the other end connected to the syringe, and causes the treatment liquid filled in the treatment liquid tank to be sucked into the syringe;
   a supply pipe that has one end connected to an intermediate section of the filling pipe and the other end disposed at a predetermined supply position, and supplies the treatment liquid discharged from the syringe to the predetermined supply position; and
   an opening/closing valve that is attached to a connection position of the supply pipe and the filling pipe, and is capable of controlling opening/closing of each of the supply pipe and the filling pipe; and
a nozzle having a cylindrical shape, the nozzle being arranged so as to oppose the stage concentrically with the locking piece, the treatment liquid being supplied from the treatment liquid supply device to the nozzle,
wherein the nozzle is formed to have an outside diameter dimension equal to or larger than an inside diameter dimension of the locking piece.

2. The wet treatment device according to claim 1,
wherein the syringe includes: a piston section having a pour-in port penetrating along an axial direction; and a syringe body having a bottomed cylindrical shape, at least a part on the base end side of the piston section being inserted to the syringe body in a manner movable forward or rearward in the axial direction, and
the other end of the filling pipe is connected to the pour-in port on a distal end side of the piston section of the syringe.

3. The wet treatment device according to claim 1,
wherein the treatment liquid tank includes: an opening section for taking in the outside air accompanying suction of the treatment liquid; and a gas supply section that supplies an inert gas toward the opening section.

4. The wet treatment device according to claim 1,
wherein the opening/closing valve is a three-way valve that can control opening/closing of the supply pipe and the filling pipe separately.

5. The wet treatment device according to claim 1,
wherein the treatment liquid supply device supplies the treatment liquid of a quantity of a degree not spilled out from the top of the wafer onto the wafer.

6. The wet treatment device according to claim 5, further comprising:
a treatment liquid holding material having a generally circular column shape, the treatment liquid holding material being arranged so as to oppose the stage concentrically with the wafer that is arranged in the stage,
wherein the treatment liquid supply device supplies the treatment liquid of a quantity of a degree not spilled out from a gap between the wafer arranged in the stage and the treatment liquid holding material to a gap between the wafer and the treatment liquid holding material.

7. The wet treatment device according to claim 5,
wherein the wafer has a disk shape with 12.5 mm outside diameter.

* * * * *